United States Patent
Kim et al.

(10) Patent No.: US 10,684,320 B2
(45) Date of Patent: Jun. 16, 2020

(54) PERFORMANCE EVALUATION METHOD OF SUSPENDED CHANNEL PLASMA WAVE TRANSISTOR

(71) Applicant: UNIST (ULSAN NATIONAL INSTITUTE OF SCIENCE AND TECHNOLOGY), Ulsan (KR)

(72) Inventors: Kyung Rok Kim, Ulsan (KR); Jong Yul Park, Ulsan (KR); Sung-Ho Kim, Ulsan (KR); Yu-Jung Jung, Ulsan (KR)

(73) Assignee: UNIST (ULSAN NATIONAL INSTITUTE OF SCIENCE AND TECHNOLOGY), Ulsan (KR)

(*) Notice: Subject to any disclaimer, the term of this patent is extended or adjusted under 35 U.S.C. 154(b) by 422 days.

(21) Appl. No.: 15/562,175

(22) PCT Filed: Dec. 31, 2015

(86) PCT No.: PCT/KR2015/014575
§ 371 (c)(1),
(2) Date: Sep. 27, 2017

(87) PCT Pub. No.: WO2017/115895
PCT Pub. Date: Jul. 6, 2017

(65) Prior Publication Data
US 2018/0080974 A1    Mar. 22, 2018

(51) Int. Cl.
*G01R 31/26* (2020.01)
*G01R 23/02* (2006.01)
*G01R 27/02* (2006.01)

(52) U.S. Cl.
CPC ........ *G01R 31/2601* (2013.01); *G01R 23/02* (2013.01); *G01R 27/02* (2013.01)

(58) Field of Classification Search
CPC .................... G01R 31/26; G01R 31/2601
See application file for complete search history.

(56) References Cited

U.S. PATENT DOCUMENTS

| 7,915,641 B2 | 3/2011 | Otsuji et al. |
| 8,053,271 B2 | 11/2011 | Shur et al. |
(Continued)

FOREIGN PATENT DOCUMENTS

| JP | 2005142304 | 6/2005 |
| JP | 2006216646 | 8/2006 |
(Continued)

OTHER PUBLICATIONS

Dyakonov et al. "Shallow Water Analogy for a Ballistic Field Effect Transistor: New Mechanism of Plasma Wave Generation by dc Current", Physical Review Letters, vol. 71, No. 15, Oct. 11, 1993, The American Physical Society, pp. 2465-2468.

(Continued)

*Primary Examiner* — Minh Q Phan
(74) *Attorney, Agent, or Firm* — Hodgson Russ LLP

(57) ABSTRACT

Provided is a method of evaluating a performance of a suspended channel plasma wave device (PWD) to evaluate a terahertz emission possibility of the suspended channel PWD based on physical properties of the suspended channel PWD. The method includes an x-axis setting operation of setting an electron drift velocity to be an x-axis; a y-axis setting operation of setting a plasma wave velocity to be a y-axis; and a device performance determining operation of determining an operation of a device by generating a design window based on a plasma wave generation condition of the suspended channel PWD and a relational expression between the plasma wave velocity and the electron drift velocity.

4 Claims, 11 Drawing Sheets

(56) References Cited

U.S. PATENT DOCUMENTS 9,018,683 B2    4/2015  Otsuji et al.
9,869,711 B2 *  1/2018  Kim .................. G01R 31/2621

FOREIGN PATENT DOCUMENTS

| JP | 2011176103 | 9/2011 |
|----|------------|--------|
| KR | 101521116 | 5/2015 |
| KR | 20160083187 | 7/2016 |
| WO | 2012073298 | 6/2012 |

OTHER PUBLICATIONS

M. Ghanashyam Krishna, Sachin D. Kshirsagar and Surya P. Tewari (2012). Terahertz Emitters, Detectors and Sensors: Current Status and Future Prospects, Photodetectors, Dr. Sanka Gateva (Ed.), ISBN: 978-953-51-0358-5, InTech.

F. Teppe et al., Terahertz Resonant Detection by Plasma Waves in Nanometric Transistors, Acta Physica Polonica A., vol. 113, No. 3 (2008).

* cited by examiner

PERFORMANCE EVALUATION METHOD OF SUSPENDED CHANNEL PLASMA WAVE TRANSISTOR

TECHNICAL FIELD

Embodiments relate to a method of estimating a performance of a suspended channel plasma wave transistor (PWT), and more particularly, to a method of estimating a performance of a suspended channel PWT using a design window.

BACKGROUND ART

Terahertz waves are undeveloped frequency resources having a bandwidth from 100 gigahertz (GHz) to 10 terahertz (THz) and correspond to an intermediate area between infrared light and a millimeter wave in an electromagnetic spectrum. Terahertz waves are in an unexplored technical field recognized as a kind of a terahertz gap due to a very high barrier to entry at a current technology level. A terahertz wave technology was mainly in an optical field at first. However, with development of nano-level electronic device/material technologies, the terahertz wave technology has been applied as a combination of an optical engineering technology and an electronics engineering technology.

In the electronics engineering technology, research on a passive element, for example, a resonant tunneling diode (RTD) and a schottky barrier diode (SBD), has been actively conducted. Recently, III-V heterojunction bipolar transistor (HBT) and high-electron-mobility transistor (HEMT) devices have succeeded in an access to a block frequency of 1 THz, which allows a sub-THz operation. In the optical engineering technology, development of devices, for example, a photoconductive switch, an optical rectification, a difference-frequency generation (DFG), an optical parametric, terahertz-quantum cascade lasers (THz-QCL), and uni-traveling-carrier photodiodes (UTC-PD), have been actualized to advance a terahertz technology.

Current nano-transistor technologies have been continuously downscaled to 20 nanometers (nm) for achieving an increased operating frequency. However, an operation at a band of 500 GHz or more may be restricted despite a channel reduction in a transit-mode. A plasma wave transistor (PWT), as a new concept element provided to solve this issue, may operate at a velocity corresponding to 10 to 100 times of a transit-mode electron drift velocity using a plasma wave defined as a space-time oscillating wave of a channel electron density. Research on a PWT for terahertz emission and detection devices operating in a frequency domain higher than a block frequency of a transistor based on a plasma resonance phenomenon of a two-dimensional (2D) channel electron density has been conducted all over the world to be used as a technology for filling the terahertz gap.

Since 1993 when Michael Shur, a professor at Rensselaer Polytechnic Institute (RPI) in the United States proposed for the first time, research on implementation and application of a terahertz emission and detection device using the PWT has been conducted in universities in the U.S., Japan, and Europe for about 20 years. However, there is still a technical difficulty in evaluating a terahertz device and properties of the terahertz device at a commercialization level.

In Terahertz Emitters, Detectors and Sensors: Current Status and Future Prospects, M. Ghanashyam Krishna, Sachin D. Kshirsagar and Surya P. Tewari, intech., and Terahertz Resonant Detection by Plasma Waves in Nanometric Transistors, F. Teppe, A. El Fatimy, S. Boubanga, D. Seliuta, G. Valusis, B. Chenaud and W. Knap, Proceedings of the 13$^{th}$ International Symposium on UFPS., a technology for reaching a terahertz range using a resonator for a plasma wave, a correlation between a frequency of the plasma wave and a drain-to-source current, and a relationship between a plasma wave velocity and a drift velocity are theoretically explained.

A method of evaluating a performance of a PWT based on the theory of the above prior arts has been filed by the present applicant and registered with Korean Patent No. 1521116. The above patent relates to a resonant PWT and has a feature of evaluating an application characteristic as a terahertz emitter.

The present applicant has provided a suspended channel PWT (referred to as an "SC-PWT") that overcomes a disadvantage of an existing resonant PWT, and filed Korean Patent Application No. 10-2014-0193098 which is directed to a configuration of an emitter and a detector based on the above configuration.

Since the SC-PWT or a suspended channel plasma wave device (referred to as an "SC-PWD") is different from a resonant PWT in basic characteristics, an evaluation methods according to a related art is inadequate for evaluation of a characteristic of a device. Accordingly, there is a need for a new evaluation method.

DISCLOSURE OF INVENTION

Technical Goals

An aspect is to provide a method of evaluating a performance of a suspended channel plasma wave device (PWD) to evaluate a terahertz emission possibility of the suspended channel PWD based on physical properties of the suspended channel PWD.

Technical Solutions

According to an aspect, there is provided a method of evaluating a performance of a suspended channel plasma wave device (PWD), the method including an x-axis setting operation of setting an electron drift velocity to be an x-axis; a y-axis setting operation of setting a plasma wave velocity to be a y-axis; and a device performance determining operation of determining an operation of a device by generating a design window based on a plasma wave generation condition of the suspended channel PWD and a relational expression between the plasma wave velocity and the electron drift velocity.

The plasma wave generation condition may include a frequency condition, an increment condition and an instability condition.

The increment condition may be to distinguish and determine an ideal drain impedance and a finite impedance.

An increment condition for the finite impedance may be to use an intersection point and a frequency condition in which a value of is fixed.

The device performance determining operation may include a z-axis setting operation of setting a channel length to be a z-axis and determining a performance of the device using a design window with a three-dimensional (3D) shape.

Effect of Invention

According to an embodiment, in a method of evaluating a performance of a suspended channel plasma wave device (PWD), it is possible to easily evaluate whether the suspended channel PWD is to operate as a terahertz emitter, by selecting performance parameters that have an influence on an emission performance, by acquiring a relationship between the performance parameters, and by designing a design window configured to verify a performance to be provided by an emitter in theory prior to an experiment. Also, it is possible to provide an effect of proposing development of a suspended channel PWD terahertz emitter using a new material through an emitter performance evaluation with respect to various substances applicable to a semiconductor device.

BEST MODE FOR CARRYING OUT THE INVENTION

Figure 1:
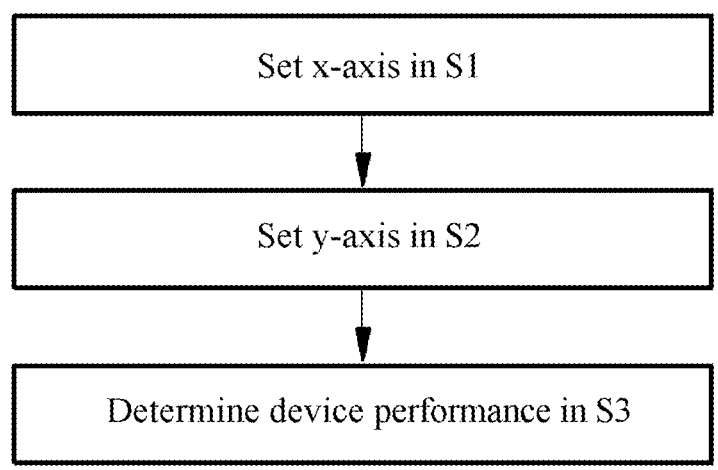
FIG. 1 is a flowchart illustrating a method of evaluating a performance of a suspended channel plasma wave transistor (PWD) according to an embodiment.

Hereinafter, embodiments will be described in detail with reference to the accompanying drawings.

Also, in a method of evaluating a performance of a suspended channel plasma wave device (PWD) according to an embodiment, a design window is shown by inducing an equation based on relational expressions provided in the following non-patent documents.

Non-Patent Document 1: Michel Dyakonov, Laboratoire' de Physique Theorique et Asteropaticules, cc 070, Univesite' Montpellier H, 34095 Montpellier, France Non-Patent Document 2: Michael S. Shur, Rensselar Polytechnic Institute, CII-9017, ECSE and Broadband Data Transport Center, Try, New York 1218

Non-Patent Document 3: M. V. Cheremisin, Solid-State Electronics 52, 338 (2008)

In a two-dimensional (2D) suspended channel plasma wave device (hereinafter, referred to as an "SC-PWD"), a dispersion relationship and a velocity of plasma-wave may be induced as shown below, when relational expressions of Non-Patent Documents 1 and 2, channel internal plasma wave relational expression, an Euler's formula and a continuity equation are used.

Channel internal plasma wave $$n_1(x,t) = (C_+ e^{\alpha_+ x} + C_- e^{\alpha_- x}) e^{-\omega t}$$

$C_\pm$: perturbation coefficient
  for downstream and upstream
$k_\pm$: wave number
  for downstream and upstream
$\omega$: angular frequency $$\omega = kv_0 \pm \sqrt{\frac{e^2 k n_0}{2m\varepsilon}} \qquad \text{Equation 1}$$

$$S_\pm = \frac{\omega}{k} = v_0 \pm \sqrt{\frac{e^2 n_0}{2m\varepsilon}} \frac{\sqrt{k}}{k} = v_0 \pm \sqrt{\frac{e^2 n_0}{2m\varepsilon k_\pm}} \qquad \text{Equation 2}$$

Here, $\omega$ denotes an angular velocity, e denotes a quantity of charge, k denotes a wave number, v denotes an electron drift velocity, n0 denotes a surface electron density, $k_\pm$ denotes a wave number for downstream or upstream, $\varepsilon$ denotes a dielectric constant of a 2D channel material, and $S_\pm$ denotes a plasma wave velocity.

When a relational expression between a wave number and a frequency disclosed in Non-Patent Document 3 is used, $k_\pm$ may be induced as shown in Equation 3 below.

$$k_+ = \frac{1 + \frac{\omega' v_0}{\alpha} - \sqrt{1 + 2\frac{\omega' v_0}{\alpha}}}{v_0^2/\alpha} \qquad \alpha = \frac{e^2 n_0}{4m\varepsilon} \qquad \text{Equation 3}$$

$$k_- = -\frac{1 - \frac{\omega' v_0}{\alpha} - \sqrt{1 - 2\frac{\omega' v_0}{\alpha}}}{v_0^2/\alpha}$$

Here, $\alpha$ denotes an acceleration component of a plasma wave, and an angular frequency $\omega'+i\omega''$ may be induced as shown below.

$$\omega' = \frac{\alpha}{2v_0}\sqrt{1 - \frac{1}{4}\left\{\left(2 - \frac{v_0^2}{\alpha L}N\pi\right)^2 - 2\right\}^2} \qquad \text{Equation 4}$$

$$\omega'' = \frac{v_0\sqrt{1 - \left(2\frac{\omega' v_0}{\alpha}\right)^2}}{1\left(\sqrt{1 + 2\frac{\omega' v_0}{\alpha}} - \sqrt{1 - 2\frac{\omega' v_0}{\alpha}}\right)} \ln|R_{n,d}| - \frac{1}{2\tau_p}$$

Here, when "$\omega''>0$" is satisfied, an amplification of a plasma wave may begin.

Also, when a drain boundary condition impedance value is denoted by Zd, a drain reflection coefficient may be induced as shown in Equation 5.

In other words, the following equation may be used, $$j_1(L) = \frac{\Psi(L)}{|Z_d|W} = e\left(\frac{\omega}{k_+}C_+ e^{ik_- L} + \frac{\omega}{k_-}C_- e^{ik_- L}\right)$$

$\Psi$: self electric potential to be summarized as follows, $$r_d = r_{d,i} - \frac{r_{d,i} + 1}{(1 - 2|Z_d|W\varepsilon\omega)e^{ik_+ L}} \qquad \text{Equation 5}$$

-continued $$r_{d,i} = \frac{1 - \frac{\omega' v_0}{\alpha} - \sqrt{1 - 2\frac{\omega' v_0}{\alpha}}}{1 + \frac{\omega' v_0}{\alpha} - \sqrt{1 + 2\frac{\omega' v_0}{\alpha}}}$$

The SC-PWD may operate as a terahertz device under conditions shown in Table 1 below.

TABLE 1

| Physical conditions for plasma-wave | Criteria |
|---|---|
| Instability | $v_0 < v_{inj} < s$ |
| Increment | $\omega'' > 0$ |
| Frequency | $f < 10$ THz |

Criteria for generation of a plasma wave of the SC-PWD may be an instability condition, an increment condition and a frequency condition. Accordingly, the SC-PWD may operate as a terahertz emitter under the conditions of Table 1, and the conditions will be observed for each parameter.

When η is induced, a basic expression showing a relationship between a plasma wave velocity and an electron drift velocity may be represented as shown in Equation 6.

$$s_+ = \left[1 + \sqrt{\frac{2}{1 + \eta - \sqrt{1 + 2\eta}}}\right] v_0 \quad \text{Equation 6}$$

$$\eta = \frac{\omega v_0}{\alpha}$$

Hereinafter, the method of evaluating a performance of a suspended channel PWD includes x-axis setting operation S1 of setting an electron drift velocity 5 to be an x-axis, y-axis setting operation S2 of setting a plasma wave velocity to be a y-axis, and device performance determining operation S3 of determining an operation of a device by generating a design window representing a relationship between the plasma wave velocity and the electron drift velocity, as shown in FIG. 1.

Hereinafter, each operation will be described.

X-Axis Setting Operation S1

A design window may include an x-axis and a y-axis, and a z-axis if necessary.

The x-axis may be set to be an electron drift velocity $v_0$. The electron drift velocity $v_0$ may gradually increase from "0."

Y-Axis Setting Operation S2

In operation S2, the y-axis of the design window may be set. A y value may change based on a change in an x value, and the y-axis may be set to be a plasma wave velocity $s_+$.

Device Performance Determining Operation S3

In operation S3, a design window may be generated based on a change in a channel length L, a channel width W, a mobility μ, a drain impedance Zd which are device parameters and a value of $v_0$, and an operating range of an emitter may be determined. An operating range of a device may be determined by applying the three conditions of Table 1.

1. Frequency Condition f<10 THz

When Equations 4 and 6 are used, a relationship between a plasma wave velocity and an electron drift velocity in each frequency condition may be induced as shown in Equation 7.

$$s_+ = \left[1 + \sqrt{\frac{2}{1 + \eta - \sqrt{1 + 2\eta}}}\right] v_0 \quad \text{Equation 7}$$

$$v_0 = \frac{\omega' l}{\eta \pi}\left[2 - \sqrt{2 + 2\sqrt{1 - (2\eta)^2}}\right]$$

$$N = 1$$

Figure 2:
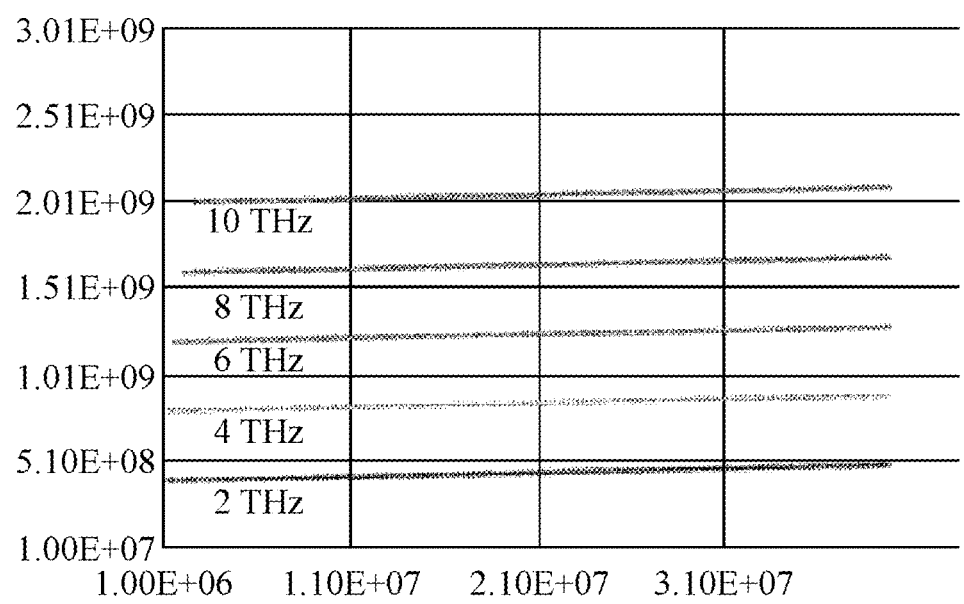
FIG. 2 is a graph illustrating a design window based on a frequency condition.

Here, a relationship between the plasma wave velocity and the electron drift velocity based on a frequency is shown in FIG. 2.

2. Increment Condition ($\omega''=0$)

Since "$\omega''=0$" refers to a point at which rd=rd, i=rd and c, Equations 4 and 6 may be used and Equation 8 may be induced as shown below.

$$v_0 = \frac{(\sqrt{1+2\eta} - \sqrt{1-2\eta})l}{2\tau_P \sqrt{1-(2\eta)^2} \ln\left[\frac{1 - \eta - \sqrt{1 - 2\eta}}{1 + \eta - \sqrt{1 + 2\eta}}\right]} \quad \text{Equation 8}$$

$$s_+ = \left[1 + \sqrt{\frac{2}{1 + \eta - \sqrt{1 + 2\eta}}}\right] v_0$$

Figure 3:
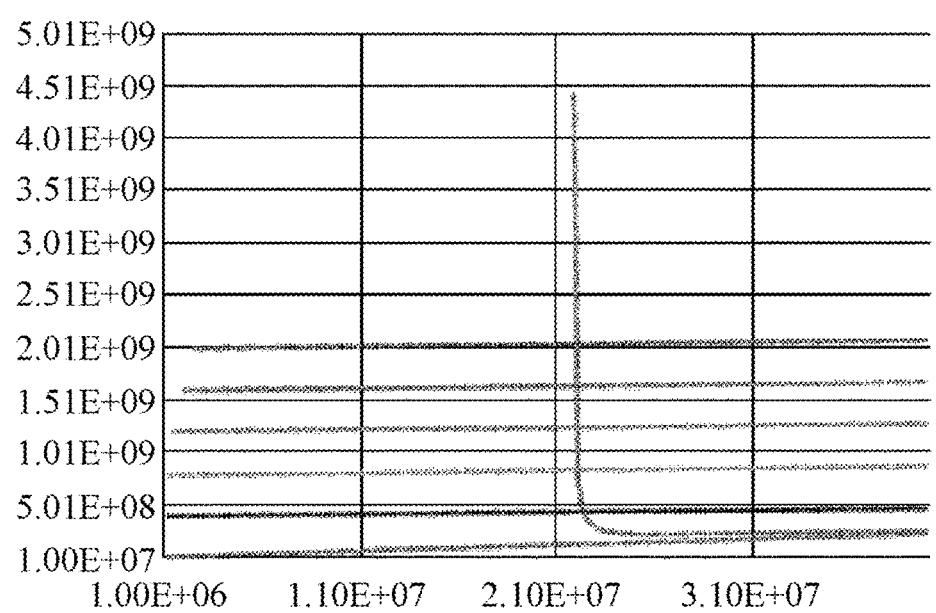
FIG. 3 is a graph illustrating a design window based on an increment condition.

When Equation 8 is used, a graph of FIG. 3 may be obtained.

3. Increment Condition—Finite Zd ($\omega''=0$)

Since "$\omega''=0$" refers to a point at which rd=rd, i=rd and c, Equations 4 and 6 may be used and an impedance may be added. Accordingly, when Equation 3 is added, Equation 9 may be induced as shown below.

$$v'_0 = \quad \text{Equation 9}$$

$$\frac{(\sqrt{1+2\eta} - \sqrt{1-2\eta})L}{2\tau_P \sqrt{1-(2\eta)^2}} \left\{ \ln\left(1 + \frac{1 - \eta - \sqrt{1 - 2\eta}}{1 + \eta - \sqrt{1 + 2\eta}}\right) \cos\left[\frac{\frac{1 - \eta - \sqrt{1 - 2\eta}}{1 + \eta - \sqrt{1 + 2\eta}} - \frac{1}{1 - 2|Z_d|W\varepsilon\omega'}}{\frac{(1 + \eta - \sqrt{1 + 2\eta})\pi}{2 - \sqrt{2 + 2\sqrt{1 - (2\eta)^2}}}}\right]^{-1} \right\}$$

$$\eta = \frac{\omega v_0}{\alpha}$$

However, since Equation 9 includes ω', it is impossible to show a window based on a change in η only. Accordingly, when a separate equation is required, Equations 7 and 9 may be used. Here, a condition "v0−v0'=0" may be satisfied and may be induced as shown in Equation 10. After ω' is fixed, a value of η may be obtained by solving a nonlinear equation of Equation 10.

Equation 10
$$\frac{\omega'l\left[2-\sqrt{2+2\sqrt{1-(2\eta)^2}}\right]}{\eta x} - \frac{(\sqrt{1+2\eta}-\sqrt{1-2\eta})L}{2\tau_p\sqrt{1-(2\eta)^2}}$$

$$\left\{\ln\left(1+\frac{1-\eta-\sqrt{1-2\eta}}{1+\eta-\sqrt{1+2\eta}}\right)\cos\left[\begin{array}{c}\frac{1-\eta-\sqrt{1-2\eta}}{1+\eta-\sqrt{1+2\eta}}-\\\frac{1}{1-2|Z_d|W\varepsilon\omega'}\\\frac{(1+\eta-\sqrt{1+2\eta})\pi}{2-\sqrt{2+2\sqrt{1-(2\eta)^2}}}\end{array}\right]^{-1}\right\}=0$$

Figure 4:
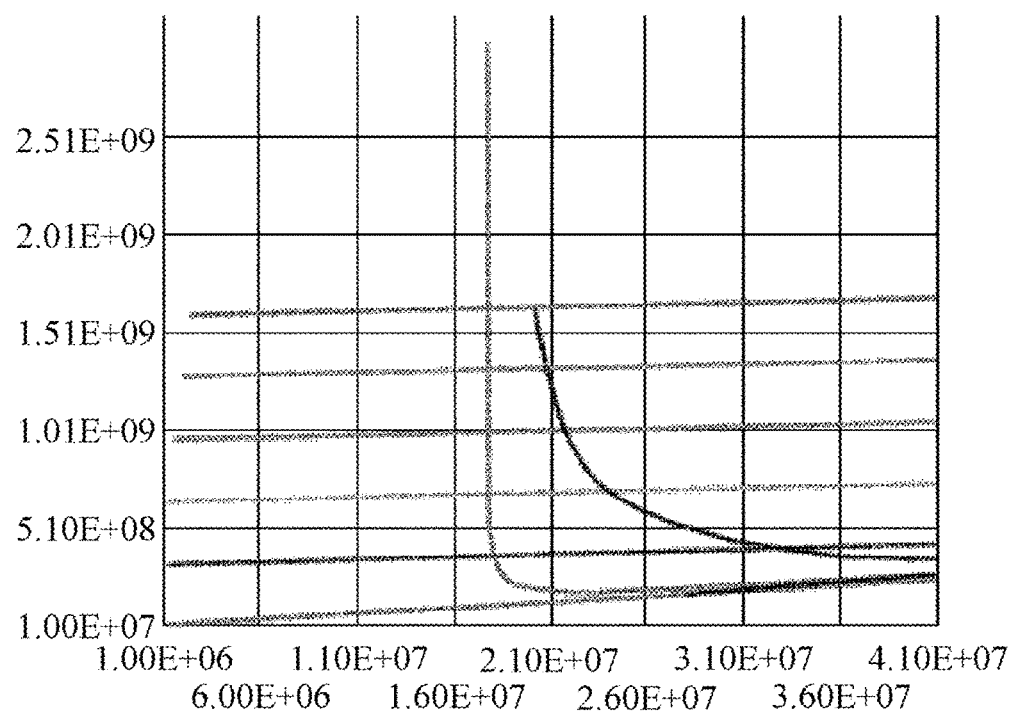
FIG. 4 is a graph illustrating a design window based on an increment condition with a finite impedance.

When Equations 9 and 10 are used, a graph of FIG. 4 may be obtained.

4. Instability Condition

For example, $v_0$ may be assumed to have a constant value across channels due to an addition of a direct current (DC) source. In this example, when it is assumed that a maximum velocity is a velocity $v_{inj}$ at which an electron is injected from a source and that $v_0$ does not exceed a plasma wave velocity s, a condition may be limited to "$v_0=v_{inj}$."

Figure 5:
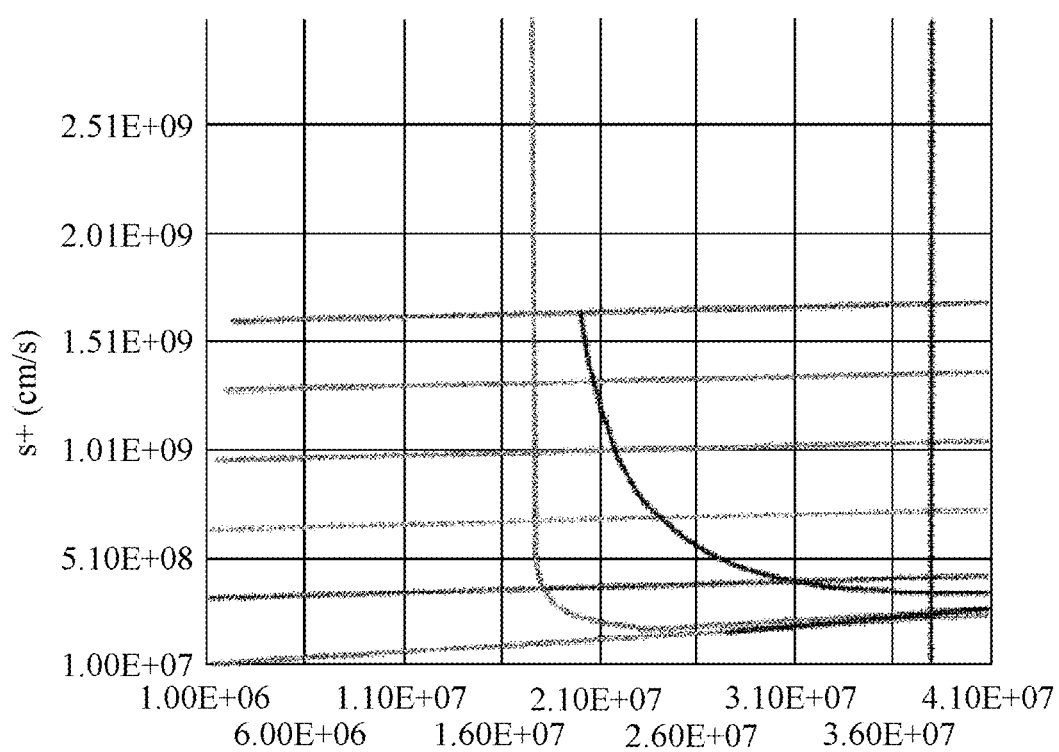
FIG. 5 is a graph illustrating a design window based on an instability condition.
Figure 6:
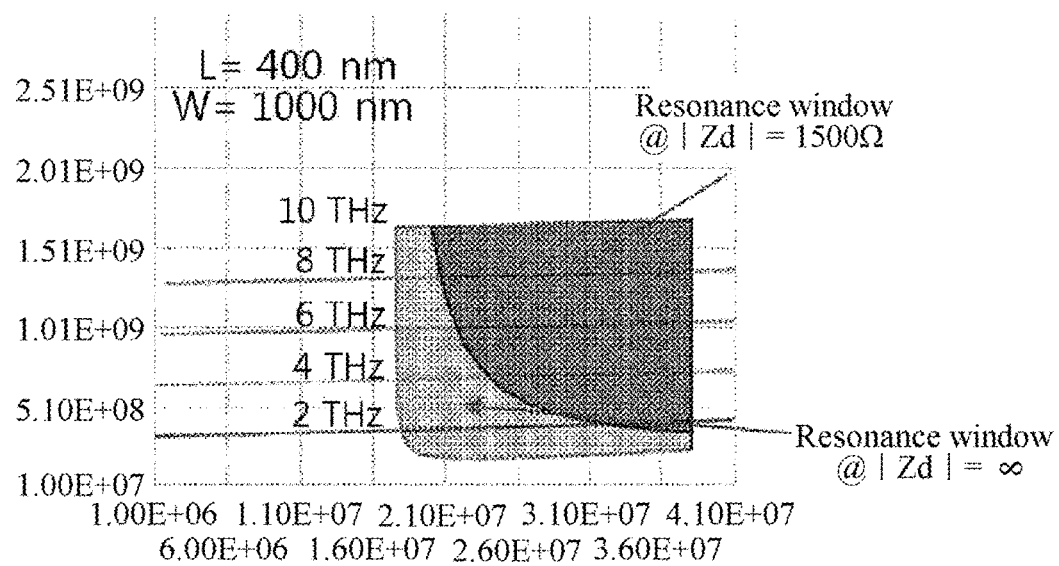
FIG. 6 is a graph illustrating a design window based on all conditions.

A graph to which the instability condition is added is shown in FIG. 5, and a final design window may be obtained as shown in FIG. 6 by combining all two conditions.

Hereinafter, further description will be provided according to embodiments.

Embodiment 1

Figure 7:
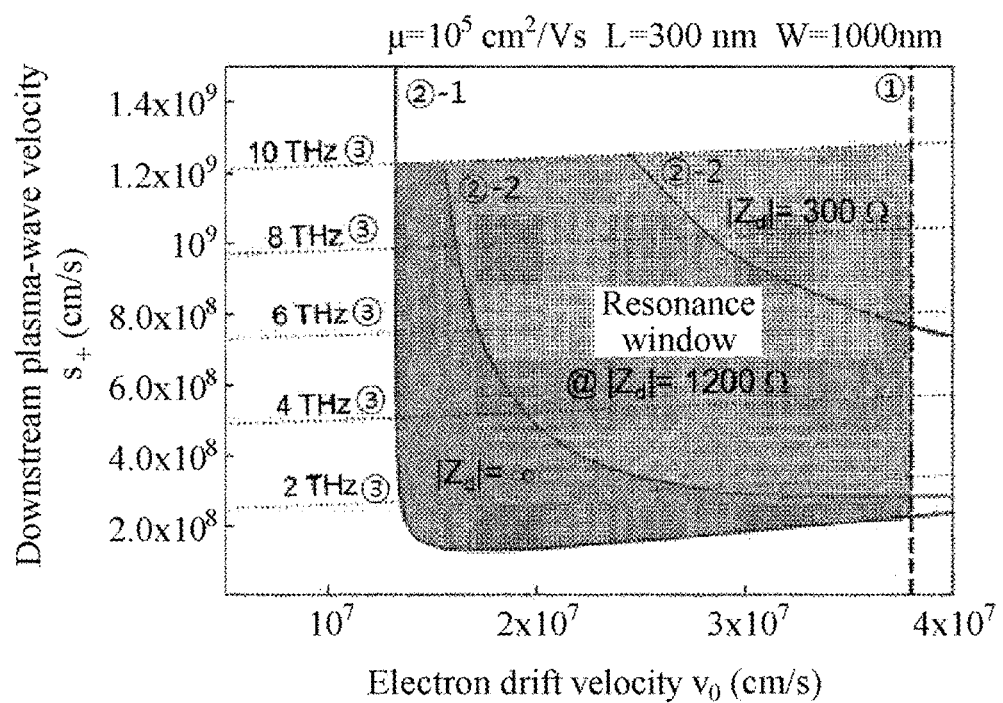
FIG. 7 is a graph illustrating a design window according to Embodiment 1.

FIG. 7 illustrates a graph of a change in a design window of an SC-PWD THz emitter based on $|Z_d|$ when suspended graphene (m=0.02 $m_0$) with a mobility of 100,000 is used as a channel material with a length L of 300 nm and width W of 1,000 nm.

Embodiment 2

Figure 8:
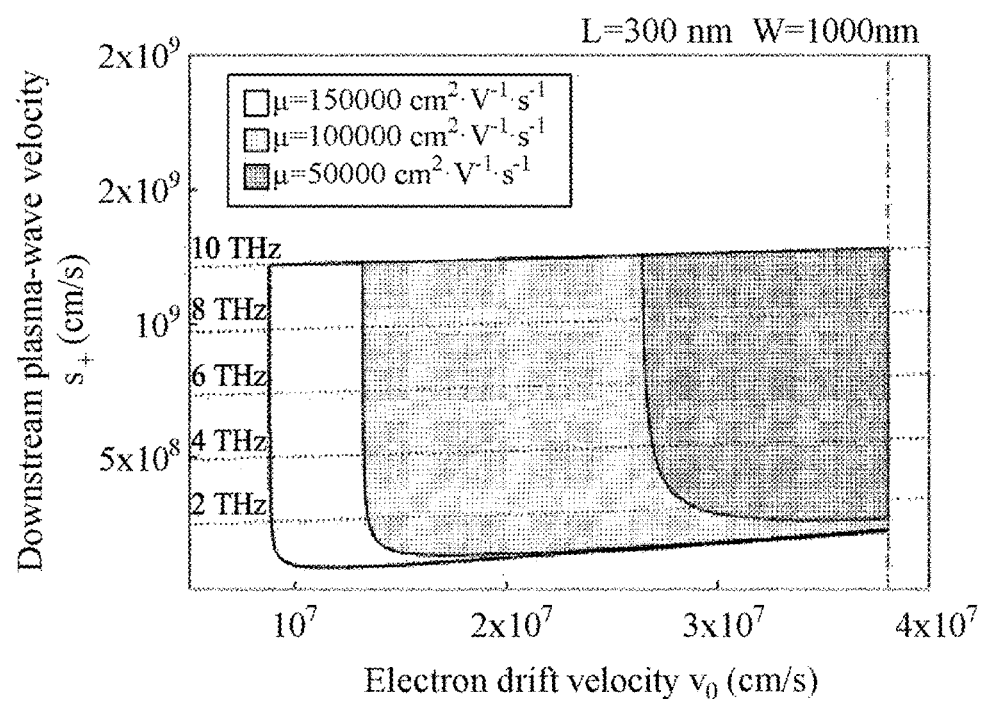
FIG. 8 is a graph illustrating a design window according to Embodiment 2.

FIG. 8 illustrates a change in a design window based on a change in a mobility. In FIG. 8, it was analyzed that a relatively wide degree of design freedom is provided at a high mobility.

Embodiment 3

Figure 9:
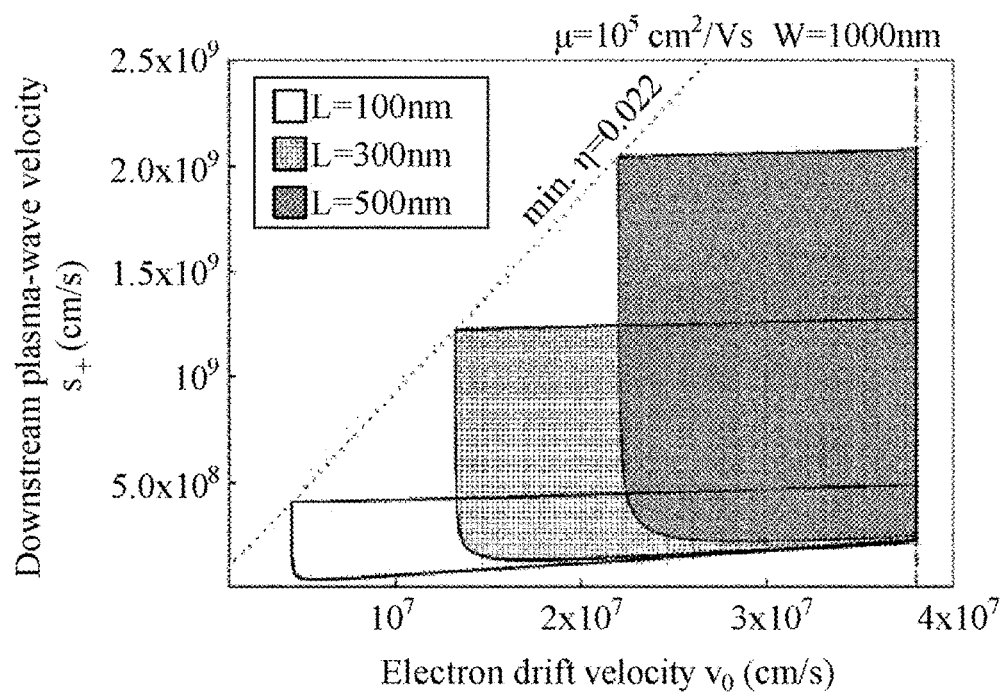
FIG. 9 is a graph illustrating a design window according to Embodiment 3.

FIG. 9 illustrates a design window changed based on a channel length at the same mobility. The same min. h is shared.

As shown in FIG. 9, when the channel length increases to $L_{max}$ while a width of the design window decreases, the design window disappears.

For suspended graphene with a mobility of 100,000 and an effective mass m of 0.02 $m_0$, $L_{max}$ of 865 nm may be calculated. Also, it was found that when a channel mobility is further increased, and when suspended graphene with a mobility of 150,000 is secured, Lmax of 1,298 nm is obtained.

Embodiment 4

Figure 10:
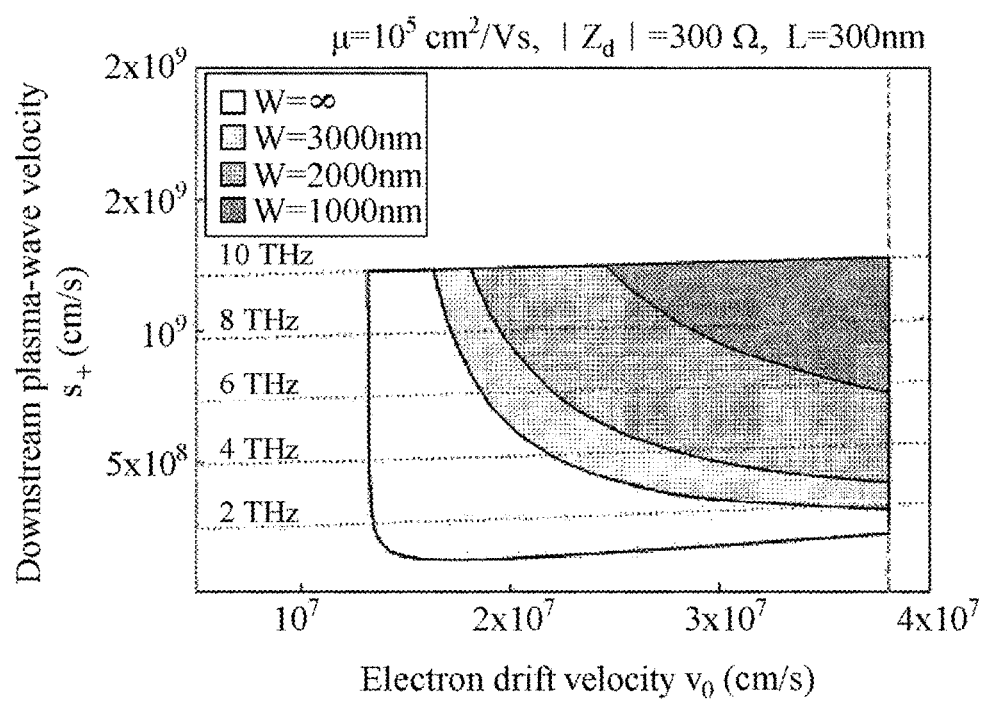
FIG. 10 is a graph illustrating a design window according to Embodiment 4.

FIG. 10 illustrates a change in a resonance window (design window) for a channel width. In FIG. 10, when the channel width increases by a predetermined degree, a frequency range greatly increases and a threshold impedance $|Z_{d,c}|$ for causing a resonance also increases. In addition, at the same time, ideally, even though a plasma wave needs to propagate in a single direction of an x-axis, a component propagating along a y-axis gradually increases due to an increase in the channel width, which may cause a concern a reduction in a characteristic. Accordingly, when an appropriate value is selected by the design window as shown in FIG. 10, an advantage of designing a useful device may be provided.

Embodiment 5

Figure 11:
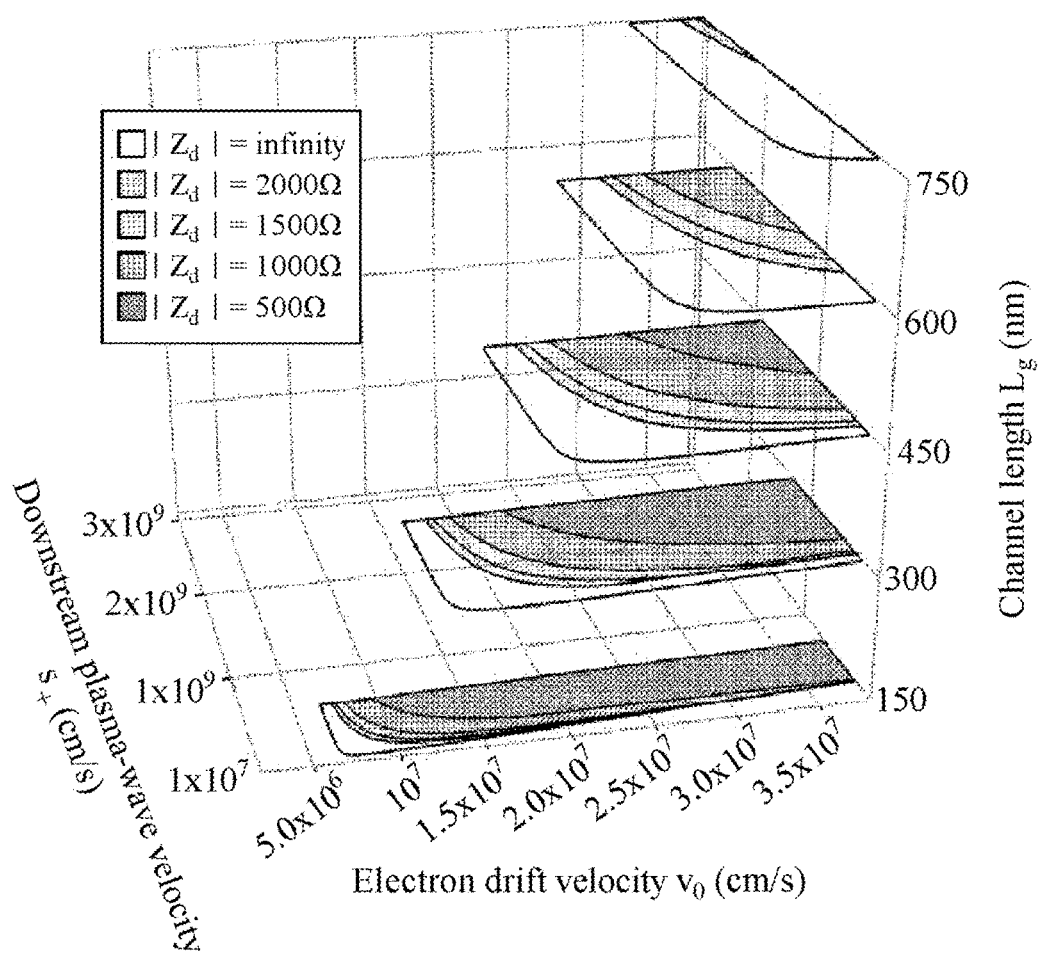
FIG. 11 is a graph illustrating a design window according to Embodiment 5.

When a channel length L is added as a z-axis, a 3D graph may be obtained as shown in FIG. 11. It is advantageous to observe a change in a resonance window for various variables at once based on FIG. 11. In particular, it can be found that when an ideal drain impedance with a channel mobility of 100,000 and an effective mass m of 0.02 $m_0$ is introduced, a high $|Zd|$ needs to be secured around $L_{max}$ of 865 nm or 800 nm.

Thus, it can be found from FIG. 11 that an SC-PWD with a channel length as short as possible needs to be fabricated to increase a feasibility of a THz emitter.

As described above, in the method of evaluating a performance of a suspended channel PWD, when a constituent material is selected, a device characteristic may be analyzed based on a channel length, a channel width and an impedance. On the other hand, when a channel length, a channel width and an impedance are selected, a material available as an emitter may be selected.

Also, when three parameters are fixed among four parameters and the other parameter is changed, a range of the changed parameter available as an emitter may be set.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A method of evaluating a performance of a suspended channel plasma wave device (PWD), the method comprising:
    providing the suspended channel PWD;
    determining a plasma wave generation condition of the suspended channel PWD, the plasma wave generation condition comprising a frequency condition, an increment condition and an instability condition;
    an x-axis setting operation of setting an electron drift velocity to be an x-axis;
    a y-axis setting operation of setting a plasma wave velocity to be a y-axis; and
    a device performance determining operation of determining an operation of the suspended channel PWD by generating a design window based on the plasma wave generation condition of the suspended channel PWD and a relational expression between the plasma wave velocity and the electron drift velocity.

2. The method of claim 1, wherein the increment condition is to distinguish and determine an ideal drain impedance and a finite impedance.

3. The method of claim 2, wherein an increment condition for the finite impedance is to use an intersection point and a frequency condition in which a value of ω' is fixed.

4. The method of claim 1, wherein the device performance determining operation comprises a z-axis setting operation of setting a channel length to be a z-axis and determining a performance of the device using a design window with a three-dimensional (3D) shape.

\* \* \* \* \*